United States Patent
Naderi et al.

(10) Patent No.: US 7,890,690 B2
(45) Date of Patent: Feb. 15, 2011

(54) SYSTEM AND METHOD FOR DUAL-PORTED FLASH MEMORY

(75) Inventors: Kaveh Naderi, Austin, TX (US); Patrick Allen Buckland, Austin, TX (US); Jason Eric Moore, Austin, TX (US); Abel Enrique Zuzuarregui, Paige, TX (US)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 11/759,348

(22) Filed: Jun. 7, 2007

(65) Prior Publication Data

US 2008/0307154 A1 Dec. 11, 2008

(51) Int. Cl.
G06F 13/00 (2006.01)
G06F 13/28 (2006.01)
G06F 12/00 (2006.01)

(52) U.S. Cl. ............... 711/103; 711/115; 711/149; 711/154

(58) Field of Classification Search ............... 711/149, 711/103, 115, 147, 154, 163, 169, 202, 220; 365/185.33, 189.05, 189.07, 189.12, 230.03, 365/230.05; 707/1, 100, 200; 709/213, 216; 710/14, 38, 62, 100, 266; 713/1, 2, 100, 713/182; 717/128; 718/102–108
See application file for complete search history.

(56) References Cited

U.S. PATENT DOCUMENTS

| | | | | |
|---|---|---|---|---|
| 5,509,134 A * | 4/1996 | Fandrich et al. | | 711/103 |
| 5,923,838 A * | 7/1999 | Hongo | | 714/42 |
| 6,092,138 A | 7/2000 | Schutte | | |
| 6,192,469 B1 * | 2/2001 | Smalley et al. | | 713/1 |
| 6,421,279 B1 * | 7/2002 | Tobita et al. | | 365/189.011 |
| 6,510,484 B1 * | 1/2003 | Kim et al. | | 710/314 |
| 6,601,131 B2 * | 7/2003 | Sezaki et al. | | 711/103 |
| 7,107,414 B2 | 9/2006 | Hidai et al. | | |
| 7,526,589 B2 | 4/2009 | Cagno et al. | | |
| 2004/0177195 A1 | 9/2004 | Buckland et al. | | |
| 2004/0255071 A1 * | 12/2004 | Larson et al. | | 710/306 |
| 2005/0256997 A1 * | 11/2005 | Koren et al. | | 711/103 |
| 2007/0250648 A1 * | 10/2007 | Picard et al. | | 710/9 |
| 2008/0307148 A1 * | 12/2008 | Naderi et al. | | 710/313 |

OTHER PUBLICATIONS

S3C4510B Specification, Samsung Electronics, Aug. 23, 2003.*
I2C Specification, Philips Semiconductors, Jan. 2000.*
24C32 Specification, Microchip Technology Inc., 2004.*
24LC41A Specification, Microchip Technology Inc., 2003.*
Microchip 24C01A/02A/04A Datasheet, 1996, Microchip Technology, Inc.

(Continued)

Primary Examiner—Yaima Campos
(74) Attorney, Agent, or Firm—Patrick E. Caldwell, Esq.; The Caldwell Firm, LLC

(57) ABSTRACT

A method for emulating a dual-port I2C device includes monitoring a bus for I2C traffic. A system receives an I2C interrupt on the bus. The system determines whether the received I2C interrupt is one of either a hardware interrupt or a software interrupt. In the event the received I2C interrupt is a hardware interrupt, the system responds to the hardware interrupt, and accesses a flash memory for read/write operation based on the hardware interrupt. In the event the received I2C interrupt is a software interrupt, the system responds to the software interrupt, and accesses a flash memory for read/write operation based on the software interrupt.

18 Claims, 4 Drawing Sheets

OTHER PUBLICATIONS

Microchip 24C32 Datasheet, 2004, Microchip Technology, Inc.
Microchip 24LC41A Datasheet, 2003, Microchip Technology, Inc.
Naderi, K., et al., "System and Method for Improved Bus Communication," Concurrently Filed U.S. Patent Application.

* cited by examiner (PRIOR ART)

SYSTEM AND METHOD FOR DUAL-PORTED FLASH MEMORY

TECHNICAL FIELD

The present invention relates generally to the field of computer memory devices and, more particularly, to a system and method for dual-ported flash memory.

BACKGROUND OF THE INVENTION

Modern electronic memory or data storage devices typically function as either volatile or non-volatile memory. Generally, volatile memory requires continuous power to store the memory contents, while non-volatile memory can retain data without a continuous power source. Non-volatile memory has many applications, including personal data assistants (PDAs), digital cameras, mobile phones, digital audio players, laptop computers, and other devices.

One type of non-volatile memory is "flash memory." Generally, flash memory is a type of electrically erasable programmable read-only memory (EEPROM). Flash memory stores information in an array, and can be programmed in small, discrete increments, such as a byte or word, for example, but must ordinarily be erased in blocks larger than required in a typical EEPROM.

Some flash memory systems couple the memory to a computer system via a bus. One common bus configuration is Inter-integrated Circuit (I2C), which is particularly useful in peripheral bus systems. Generally, I2C permits multiple bus masters on a single bus. I2C is a trademark of Philips Corp.

But some current flash memory modules include only one I2C port. In some applications, technical conflicts arise when more than one I2C master attempts to access the same, one-port flash memory. Generally, the I2C protocol permits multiple bus masters, but relegates conflict detection and arbitration functionality to the bus masters.

Assigning the conflict detection and arbitration functionality to the I2C bus masters often results in the application programmer writing program code to address this issue, which increases application design cost and complexity. Further, arbitration by and between multiple bus masters can cause the I2C bus to lock up, a costly failure condition, or otherwise to become inoperative.

Another solution provides arbitration functionality through extra side-band signals. This approach, however, suffers from the drawback that it increases the number of signals, which increases design and implementation costs as well. Further, additional signals also increase power consumption.

Additionally, some applications operate with two buses on separate power boundaries. For example, one typical configuration includes a standby power domain and a main power domain. Generally, the standby power domain engages when the system couples to an external power source and, in one system, operates at 3.3V. Generally, the main power domain engages when the system powers on and, in one system, operates at 2.5V. Typical arbitration schemes that address I2C bus master arbitration fail to account for multiple power domain configurations. Known solutions that do account for multiple power domain configurations are rare, overly complicated, and expensive.

Additionally, in some applications, the I2C bus standard allows the multiple bus masters to operate under different I2C addressing protocols. For example, one bus master can run using 16-bit addressing, which most current flash memory devices use. Another bus master, coupled to the same bus, can run using legacy 8-bit addressing, which certain older flash memory devices use. Typical flash memory devices do not support multiple I2C addressing protocols.

There are a number of other features not supported by current dual-port I2C systems and methods. For example, current systems/methods do not support mixed-mode addressing. Nor do current systems/methods support multiple chips on a single I2C bus.

Therefore, there is a need for a system and/or method for dual-ported I2C flash memory devices that addresses at least some of the problems and disadvantages associated with conventional systems and methods.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

It is, therefore, one aspect of the present invention to provide for an improved flash memory system.

It is a further aspect of the present invention to provide for an improved I2C bus device.

It is a further aspect of the present invention to provide for an improved I2C bus interface and method.

It is a further aspect of the present invention to provide for an improved dual-ported I2C flash memory device.

It is a further aspect of the present invention to provide for an improved I2C flash memory device supporting mixed mode and multiple mode addressing.

The aforementioned aspects and other objectives and advantages can now be achieved as described herein. A method for emulating a dual-port I2C device includes monitoring a bus for I2C traffic. A system receives an I2C interrupt on the bus. The system determines whether the received I2C interrupt is one of either a hardware interrupt or a software interrupt. In the event the received I2C interrupt is a hardware interrupt, the system responds to the hardware interrupt, and accesses a flash memory for read/write operation based on the hardware interrupt. In the event the received I2C interrupt is a software interrupt, the system responds to the software interrupt, and accesses a flash memory for read/write operation based on the software interrupt.

In an alternate embodiment, a system includes a flash memory array configured to couple to an I2C bus. A first I2C port couples to the flash memory array, and comprises a first pair of I2C wires and a hardware I2C engine coupled to the first pair of I2C wires and configured in a first addressing protocol. A second I2C port couples to the flash memory array, and comprises a second pair of I2C wires and a software I2C engine coupled to the second pair of wires and configured in a second addressing protocol, differing from the first addressing protocol. The first I2C port interfaces with the flash memory array as a single array. The second I2C port interfaces with the flash memory array as two independent arrays. The first I2C port and the second I2C port are accessible to the I2C bus.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
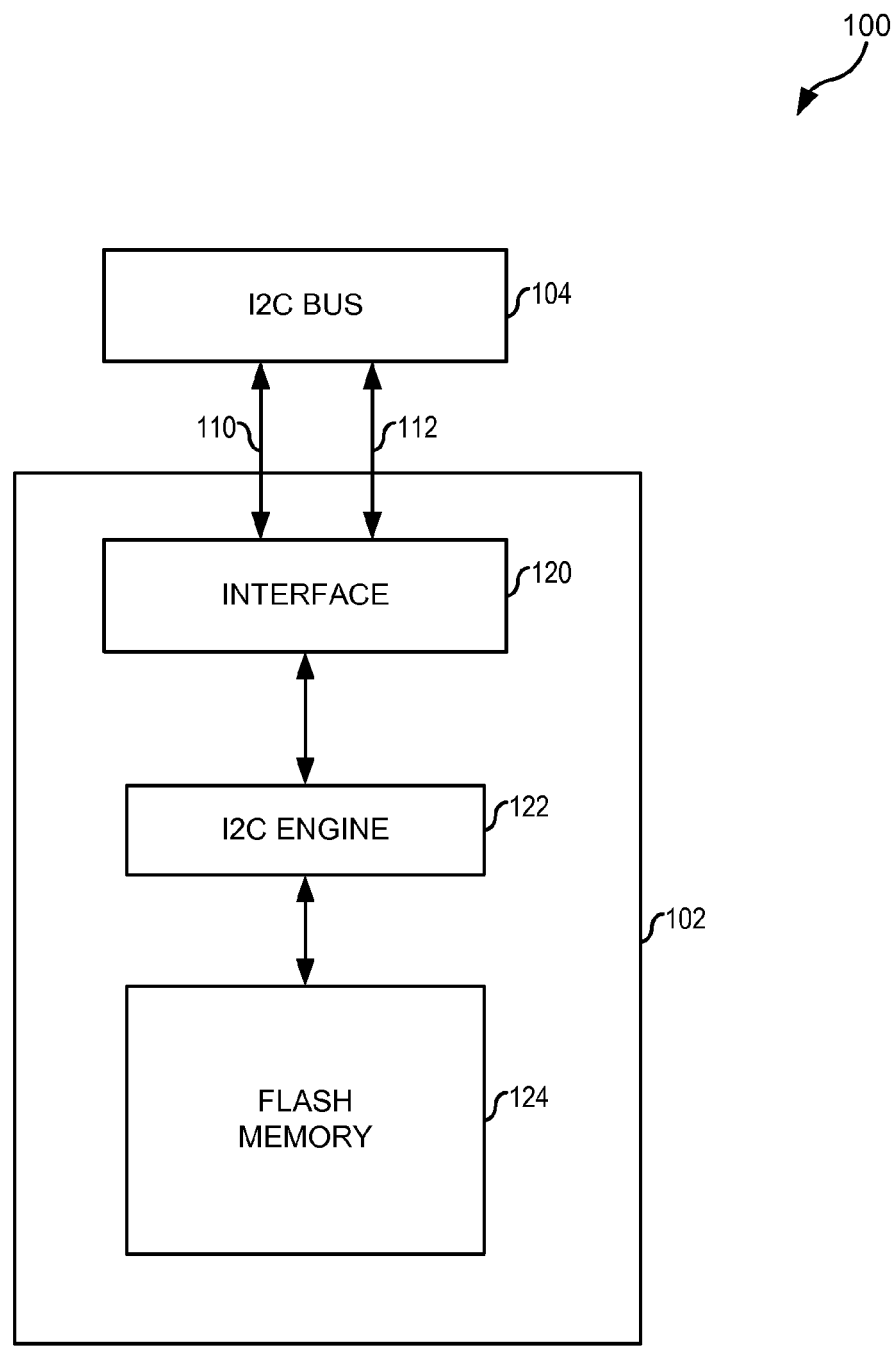
FIG. 1 illustrates a block diagram showing a common I2C memory system in accordance with the Prior Art.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

The invention can take the form of an entirely hardware embodiment, an entirely software embodiment, or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus or otherwise tangible medium that can contain, store, communicate, propagate, or transport the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Referring now to the drawings, FIG. 1 is a high-level block diagram illustrating certain components of an I2C flash memory system 100, in accordance with the Prior Art. System 100 includes a memory device 102 coupled to an I2C bus 104. As illustrated, memory device 102 couples to I2C bus 104 via a pair of wires 110 and 112. As shown, wires 110 and 112 represent the serial data (SDA) and serial clock (SCL) lines that implement the I2C protocol, as one skilled in the art will understand.

Memory device 102 includes a bus interface 120, an I2C engine 122, and a flash memory array 124. As shown, memory device 102 includes a separate bus interface and I2C engine. In an alternate configuration, the bus interface and I2C engine form a single module. Generally, bus interface 120 couples to wires 110 and 112, and performs standard bus interface operations, such as, for example, monitoring bus transactions for operations directed at (or addressed to) memory device 102. Generally, I2C engine 122 couples to bus interface 120 and interprets the bus transactions identified by the bus interface in accordance with the I2C bus protocol.

I2C engine 122 also executes on flash memory 124 read and write instructions directed to memory device 102. As such, I2C flash memory system 100 is configured to store data received from an I2C bus in a flash memory array, and to retrieve data stored in the flash memory array and to write that data to the I2C bus, all in accordance with the standard I2C protocol. One skilled in the art will understand that certain technical details and optional configurations, unnecessary to understand the embodiments of the present invention, have been omitted in this overview for simplicity.

As illustrated, memory device 102 includes only a single I2C port, namely, the pair of wires 110 and 112. Moreover, so configured, memory device 102 supports only a single addressing mode, and presents a single memory profile to the other devices coupled to the I2C bus 104. As such, memory device 102 suffers from the disadvantages described above.

Figure 2:
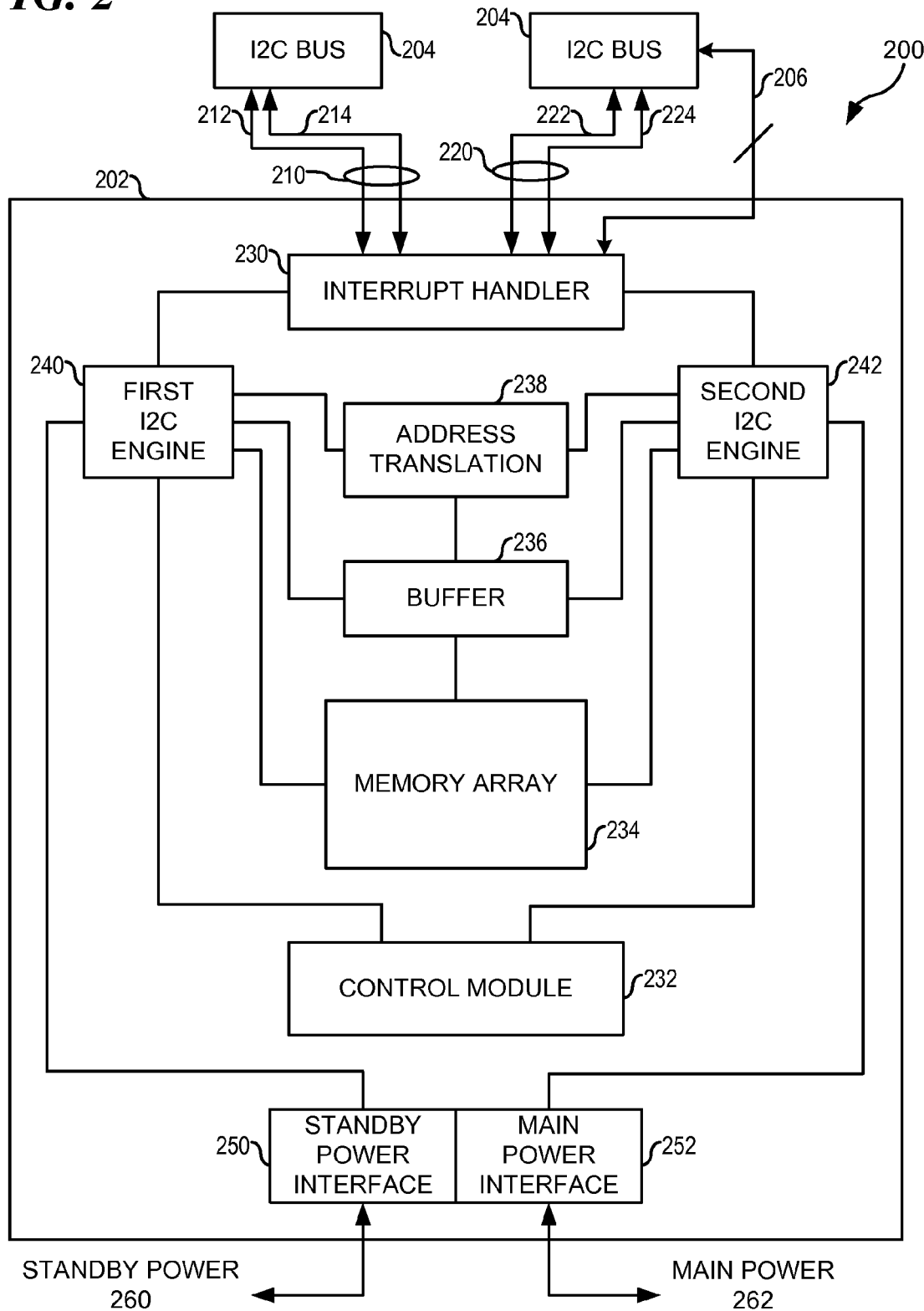
FIG. 2 illustrates a block diagram showing an improved I2C memory system in accordance with a preferred embodiment.

FIG. 2 is a block diagram illustrating certain components of an improved dual-port I2C flash memory system, in accordance with a preferred embodiment of the present invention. In particular, memory system 200 includes a memory device 202 coupled to an I2C bus 204.

Memory device 202 is a specially configured memory device, described in more detail below. I2C bus 204 is an otherwise conventional I2C bus. Memory device 202 couples to I2C bus 204 through a first port "A" 210 and a second port "B" 220. Memory device 202 also couples to I2C bus 204 through a support signal connection 206.

Generally, first port 210 and second port 220 are otherwise conventional I2C bus connections, each comprising a data line and a clock line. Specifically, first port 210 includes serial data line (SDA) 212 and serial clock line (SCL) 214. Second port 220 includes SDA 222 and SCL 224.

Memory device 202 receives support signals from I2C bus 204 through support signal connection 206. In one embodiment, support signals include custom address signals A0, A1, and A2, as one skilled in the art will understand, and a high/low signal, described in more detail below.

In the illustrated embodiment, memory device 202 includes a distinct, discrete pair of wires for each of port 210 and port 220. Additionally, support signal connection 206 can also comprise a plurality of signal lines. Moreover, one skilled in the art will understand that in some embodiments, first port 210, second port 220, and support signal connection 206 can be distributed across a variety of pins of a chip or adapter configured to mount to a system board or other device. Accordingly, for ease of illustration and discussion, memory device 202 is depicted with discrete ports 210, 220, and a composite support signal line 206. One skilled in the art will therefore understand that certain features of the disclosed embodiments can be implemented in a variety of particular wiring configurations.

Memory device 202 includes interrupt handler 230. Generally, interrupt handler 230 is configured to monitor first port 210, second port 220, and support signal connection 206 for I2C bus traffic addressed to memory device 202. As such, in one embodiment, interrupt handler 230 is generally configured as a bus interface for memory device 202.

In operation, interrupt handler 230 directs observed bus transactions addressed to memory device 202 to either a first I2C engine 240 or a second I2C engine 242. First I2C engine 240 and second I2C engine 242, described in more detail below, couple to a number of other components of memory device 202.

In particular, first I2C engine 240 and second I2C engine 242 couple to a control module 232. Control module 232 is an otherwise conventional control module, and is generally configured to provide command and control signals to various components of memory device 202.

First I2C engine 240 and second I2C engine 242 also couple to a memory array 234. Memory array 234 is an otherwise conventional memory array, modified as described below. First I2C engine 240 and second I2C engine 242 also couple to a buffer 236. Buffer 236 is an otherwise conventional memory buffer, modified as described below.

First I2C engine 240 and second I2C engine 242 also couple to an address translation table 238. Address translation table 238 is an otherwise conventional address translation table, modified as described below, and can be implemented in either hardware or software. First I2C engine 240 and second I2C engine 242 also couple to power interfaces.

In particular, first I2C engine 240 couples to standby power interface 250. Standby power interface 250 is an otherwise conventional power interface, and couples to an external system standby power domain 260. Second I2C engine 242 couples to main power interface 252. Main power interface 252 is an otherwise conventional power interface, and couples to an external system main power domain 262.

Generally, the I2C engines 240 and 242 serve to interpret interrupts (i.e., I2C traffic) received from interrupt handler 230 to apply memory operations on a memory array 234, in accordance with the I2C protocol. As used herein, memory operations include read, write, erase, and other operations typical in flash memory or general programmable ROM memories.

In operation, very broadly, interrupt handler 230 monitors first port 210, second port 220, and support signal connection 206 for bus transactions addressed to memory device 202, which are configured as interrupts in one embodiment. Interrupt handler 230 directs bus transactions received through first port 210 to first I2C engine 240. Interrupt handler 230 directs bus transactions received through second port 220 to second I2C engine 242. As described in more detail below, each of I2C engines 240 and 242 interfaces with the I2C bus (through interrupt handler 230) in a particular configuration.

Specifically, in one embodiment, first I2C engine 240 emulates a 512-byte flash memory and second I2C engine 242 emulates two 256-byte flash memories. In a preferred embodiment, memory device 202 emulates a 24C32 chip and a 24C04 chip, both as manufactured by Microchip Technology, Inc. In one embodiment, memory device 202 implements first I2C engine 240 in hardware and implements second I2C engine 242 in software.

In one embodiment, memory device 202 can be a programmable system-on-chip (PSOC). In a preferred embodiment, memory device 202 is a PSOC, such as, for example, a PSOC as manufactured by Cypress, Inc., and programmed to perform the functions described herein. In an alternate embodiment, memory device 202 can be an otherwise programmable logic and memory device, configured as described herein.

In the illustrated embodiment, memory device 202 includes two physical ports, or bus connections, each comprising a pair of wires. In an alternate embodiment, memory device 202 includes a single physical port, such as, for example, first port 210, and support signal connection 206. So configured, interrupt handler 230 can identify to which of first I2C engine 240 and second I2C engine 242 to direct a particular bus transaction, based on the signals received (or, in one embodiment, the state of the pins) at first port 210 and support signal connection 206.

In the illustrated embodiment, memory device 202 includes a single memory array 234. In an alternate embodiment, memory device 202 includes a plurality of memory arrays 234. So configured, in one embodiment, each I2C engine couples to a dedicated memory array 234. In an alternate embodiment, each I2C engine couples to each memory array 234, and interfaces with each memory array 234 in a similar manner. For example, a first I2C engine interfaces with each memory array as a single 512 byte flash memory, while a second I2C engine interfaces with each memory array as a pair of 256 byte flash memories.

In a preferred embodiment, memory device 202 is configured as described with respect to FIG. 3, below.

Figure 3:
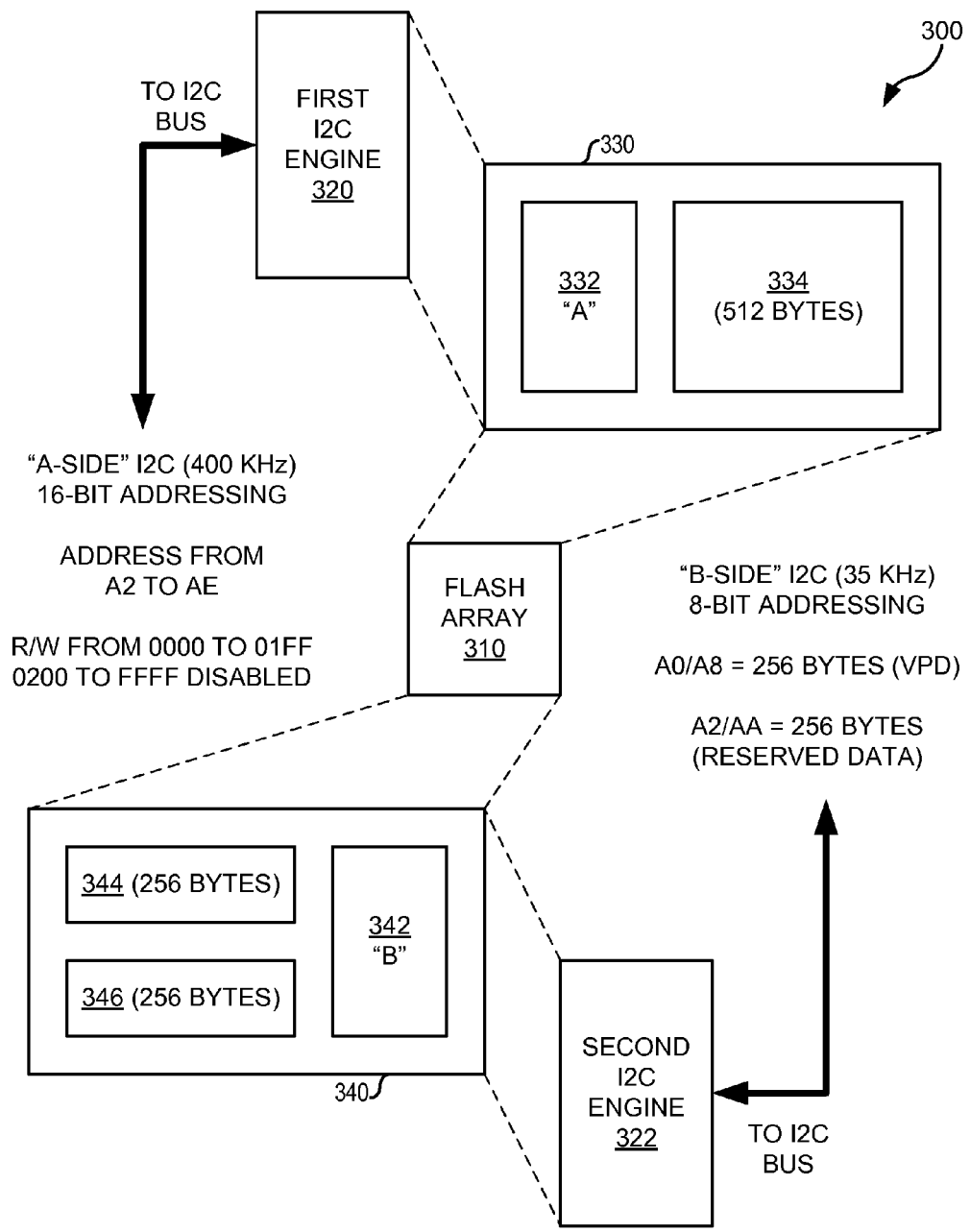
FIG. 3 illustrates a high-level block diagram showing an improved I2C memory system in accordance with a preferred embodiment.

FIG. 3 is a high-level block diagram illustrating certain components of an improved dual port I2C flash memory system 300, in accordance with a preferred embodiment. System 300 includes flash memory array 310. Flash memory array 310 is an otherwise conventional flash memory array.

System 300 includes a first I2C engine 320 and a second I2C engine 322. Generally, each of I2C engine 320 and 322 interfaces with flash array 310 in a configuration that emulates a particular flash memory device or arrangement. In the illustrated embodiment, first I2C engine 320 interfaces with flash array 310 so as to emulate a virtual device 330, described in more detail below. Similarly, second I2C engine 322 interfaces with flash array 310 so as to emulate a virtual device 340, described in more detail below.

Virtual device 330 includes I2C port 332 and flash memory array 334. Generally, I2C port 332 interfaces with the I2C bus at 400 KHz, using a 16-bit (double byte) protocol with a 32 byte write buffer. In a preferred embodiment, I2C port 332 responds to a particular, pre-determined I2C slave address from between A2 and AE. In a preferred embodiment, virtual device 330 receives support signals in the form of supplementary address pins A0, A1, and A2, which comprise a device select of an I2C control byte.

Flash memory array 334 appears as a 512-byte array, and is configured such that memory addresses from 0000 to 01FF are available for memory operations. In one embodiment, in virtual device 330, memory addresses from 02FF to FFFF are not available for memory operations. Instead, writes to these unavailable memory addresses are ignored, and reads from these unavailable memory addresses return zeroes. In a preferred embodiment, system 300 stores vital product data (VPD) in these unavailable memory addresses. As described below, in one embodiment, the VPD is available through virtual device 340.

Virtual device 340 includes I2C port 342, first flash memory array 344, and second flash memory array 346. Generally, I2C port 342 interfaces with the I2C bus at 35 KHz, using an 8-bit (single byte) addressing protocol, with an 8 byte write buffer. In a preferred embodiment, I2C port 342 responds to one of two particular sets of I2C slave addresses, described in more detail below.

First flash memory array 344 and second flash memory array 346 each appears as a 256 byte flash memory array. In a preferred embodiment, first flash memory array 344 comprises VPD and second flash memory array 346 comprises reserved data. In a particular embodiment, second flash memory array 346 corresponds to the available memory of virtual device 330, and is therefore unavailable to virtual device 340. In an alternate embodiment, virtual device 340 can perform normal memory operations on second flash memory array 346.

In a preferred embodiment, I2C port 342 accesses first flash memory array 344 in response to I2C slave addresses A0 or A8. That is, system 300 returns VPD when addressed at I2C slave address A0/A8. I2C port 342 accesses a second flash memory array 346 in response to I2C slave addresses A2 or AA. In an alternate embodiment, I2C port 342 also (or alternatively) responds to I2C slave addresses B0/B8 and B2/BA, in a similar fashion.

In a preferred embodiment, I2C port 342 responds to either A0/A2 or A8/AA based on support signals in the form of a high/low address pin. That is, when the high/low address pin is high, I2C port 342 responds to I2C slave addresses A2 and AA. Similarly, when the high/low address pin is low, I2C port 342 responds to I2C slave addresses A0 and A2. In one embodiment, the high/low address pin can be fixed in a particular state. In an alternate embodiment, the high/low address pin can be programmed during system operation.

Thus, in one embodiment, I2C devices access the system 300 VPD through virtual device 340, that is, second I2C engine 322. Similarly, devices desiring to dynamically read/write the memory contents of flash memory 310 access system 300 through virtual device 330, that is, first I2C engine 320. As described above, in one embodiment the first I2C engine couples to a standby power domain and the second I2C engine couples to a main power domain. In an alternate embodiment, the second I2C engine instead couples to the standby power domain, allowing VPD access in a standby mode. Thus, in this embodiment, the system design engineer can elect whether to support the VPD information in standby mode.

In an alternate embodiment, both virtual devices 330 and 340 are configured to read and write throughout the entire flash array 310 address space. That is, virtual device 330 can read/write to the entire 512 bytes of memory array 310, as memory array 334. And virtual device 340 can read/write to the entire 512 bytes of memory array 310, as 256-byte memory array 344 and 256-byte memory array 346.

As described in more detail below, the present invention provides numerous technical advantages.

First, generally, a single module (e.g., memory device 202 of FIG. 2) can emulate a single flash memory device that includes two separate I2C engines that can communicate to two independent I2C masters. In one embodiment, the module and one of the I2C engines operate on standby power and support 16-bit addressing to what appears as a single 512 byte flash memory array. The other I2C engine runs on main power and supports 8-bit addressing to what appears as two distinct 256 byte flash memory arrays.

So configured, the device functions as a dual-port I2C flash module. Accordingly, the system does not require additional conflict detection and arbitration functionality. Additionally, both I2C bus masters can operate independently of each other. One skilled in the art will understand that while both I2C masters cannot access the memory array at the same physical time (in which case one master will receive bus access and one master will be held off), the I2C protocol addresses this conflict by allowing the I2C bus to be stalled in a manner transparent to the bus masters. One such mechanism, for example, is clock stretching, defined in the I2C specification.

As described above, in one embodiment the present invention is implemented as a specially programmed Cypress PSOC. In this particular embodiment, additional technical information will aid one skilled in the art in understanding the present invention. The following information is offered for illustrated purposes and is not intended as limiting.

In the Cypress PSOC embodiment, the PSOC emulates 512 bytes of EEPROM memory in the PSOC flash module address space 0x3dc0 to 0x3fc0. As the PSOC flash module is organized into 64 byte blocks, in a particular embodiment, the emulated EEPROM resides in the top of the PSOC memory (16 k), in 512 total blocks (16 k/64), which results in occupation of blocks 248 to 255, (0 based).

In the PSOC embodiment, the I2C interrupt handler reads from the flash module, which helps reduce I2C bus utilization time. The PSOC control module blocks other background tasks during any reading or writing to the flash module, which helps reduce PSOC latency relating to I2C interrupt handling.

One skilled in the art will understand that writing to a flash module generally requires that a whole block be updated during each write. As such, in one embodiment, the PSOC firmware includes a 32-byte EEPROM buffer (EEpromBuffer [ ]). FIG. 2 shows a general implementation of this component as buffer 236. So configured, a flash update can complete within approximately 10-15 milliseconds, which is within the delay of 20 milliseconds between writes that is currently implemented by the SCSI enclosure Services (SES) system.

Figure 4:
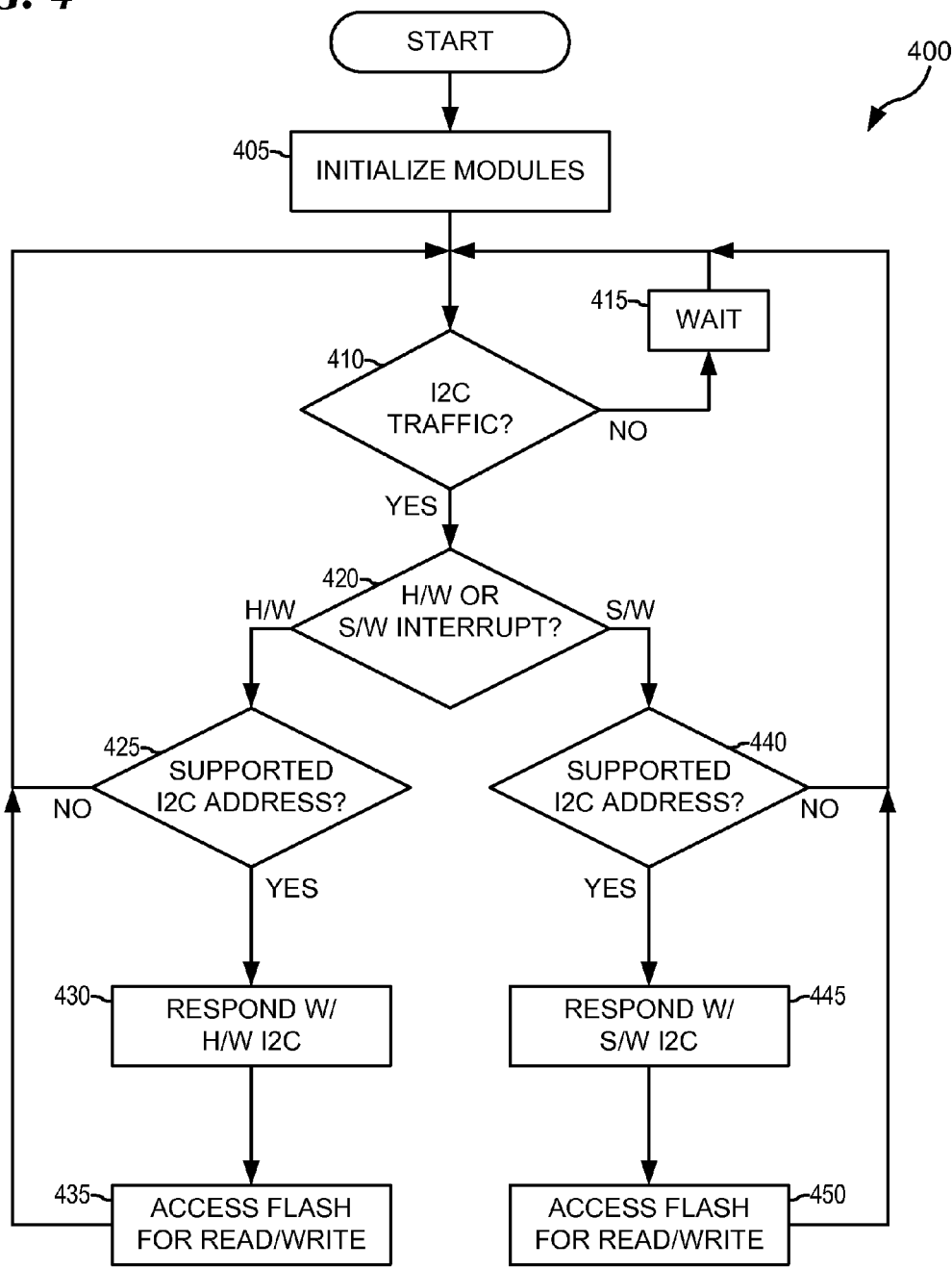
FIG. 4 illustrates a high-level flow diagram depicting logical operational steps of an improved dual-port I2C flash memory method, which can be implemented in accordance with a preferred embodiment.

FIG. 4 illustrates one embodiment of a method for providing a dual-port I2C flash memory device. Specifically, FIG. 4 illustrates a high-level flow chart 400 that depicts logical operational steps performed by, for example, system 200 of FIG. 2, which may be implemented in accordance with a preferred embodiment. Generally, one more components of memory device 202 perform the steps of the method, unless indicated otherwise. As indicated at block 405, the process begins, wherein memory device 202 initializes various modules and components within memory device 202.

Next, as indicated at decisional block 410, the memory device monitors the I2C bus for I2C traffic addressed to the memory device. If at block 410 there is no I2C traffic addressed to the memory device, the process continues along the NO branch to block 415, wherein the memory device waits, returning to decision block 410.

If at block 410 there is I2C traffic addressed to the memory device, as, for example, in the form of an interrupt, the process continues along the YES branch to decisional block 420. As indicated at block 420, the memory device determines whether the I2C traffic represents a hardware interrupt or a software interrupt. As described above, in one embodiment, the memory device determines whether the I2C traffic represents a hardware interrupt or a software interrupt based on the particular address to which the interrupt is directed. In an alternate embodiment, the memory device determines whether the I2C traffic represents a hardware interrupt or software interrupt based on the particular port that receives the I2C traffic.

If at decision block 420 the memory device determines that the I2C traffic represents a hardware interrupt, the process continues along the hardware (H/W) branch to decisional block 425. As indicated at block 425, the memory device determines whether the hardware interrupt is directed to a supported I2C address. If at block 425 the hardware interrupt is not directed to a supported I2C address, the process continues along the NO branch, returning to decisional block 410. If at block 425 the hardware interrupt is directed to a supported I2C address, the process continues along the YES branch to block 430.

Next, as indicated at block 430, the memory device responds to the hardware interrupt with the hardware I2C engine. In the illustrated embodiment of FIG. 2, first I2C engine 240, for example, is the hardware I2C engine. In one embodiment, responding to the hardware interrupt includes sending an acknowledge signal in accordance with the I2C protocol. Next, as indicated at block 435, the memory device accesses the flash array for read/write or other memory operations, in accordance with the hardware interrupt, and the process returns to decisional block 410.

If at decisional block 420 the memory device determines that the I2C traffic represents a software interrupt, the process continues along the software (S/W) branch to decisional block 440. As indicated at block 440, the memory device determines whether the software interrupt is directed to a supported I2C address. If at block 440 the software interrupt is not directed to a supported I2C address, the process continues along the NO branch, returning to decisional block 410. If at block 440 the software interrupt is directed to a supported I2C address, the process continues along the YES branch to block 445.

Next, as indicated at block 445, the memory device responds to the software interrupt with the software I2C engine. In the illustrated embodiment of FIG. 2, second I2C engine 242, for example, is the software I2C engine. In one embodiment, responding to the software interrupt includes sending an acknowledge signal in accordance with the I2C protocol. Next, as indicated at block 450, the memory device accesses the flash array for read/write or other memory operations, in accordance with the software interrupt, and the process returns to decisional block 410.

So configured, the memory device generally monitors the I2C bus to which it is coupled for I2C traffic addressed to one of its two I2C ports and/or emulated flash arrays. The memory device sorts I2C traffic addressed to it by distinguishing, in one embodiment, between hardware and software interrupts, each of which is addressed to a distinct I2C port of the memory device. As described above, the particular embodiments that implement the steps of the method described herein provide numerous technical advantages.

Comparison of the embodiments disclosed herein with a device representative of at least some of the Prior Art illustrates certain technical advantages of the present invention. For example, the embodiments disclosed herein offer multiple-mode I2C addressing, and additionally allow for multiple chips on an I2C bus. By contrast, the Microchip 24LC41A, a typical Prior Art device, is only a single chip per I2C bus, and only offers single mode addressing. Additionally, the embodiments disclosed herein offer single byte addressing on one of two I2C buses, and double byte addressing on the other bus. By contrast, the Microchip 24LC41A only offers single mode (8-bit) addressing.

Accordingly, embodiments of the present invention provide dual ported I2C flash devices that overcome disadvantages of prior art systems and methods. Specifically, embodiments of the present invention support more than one I2C master accessing the same flash memory, without also introducing complicated conflict detection and arbitration functionality. Moreover, the embodiments disclosed herein also avoid I2C bus lock-up and other failure conditions associated with problematic conflict detection and arbitration functionality.

Furthermore, embodiments of the present invention also account for multiple power domain configurations, without also introducing complicated and/or costly additional hardware. Neither do the embodiments disclosed herein require excessively costly additional signals, in terms of power consumption. The embodiments disclosed herein also support different addressing protocols, including mixed-mode addressing, multiple mode addressing, and legacy support. Because the embodiments disclosed herein support custom I2C addressing, the present invention offers additional system configuration and other advantages readily apparent to one skilled in the art.

It will be appreciated that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A method for emulating a dual-port Inter-integrated Circuit slave device, comprising:
   monitoring, by an Inter-integrated Circuit slave device, a bus for Inter-integrated Circuit traffic;
   receiving, by the slave device, an Inter-integrated Circuit interrupt on the bus; determining, by the slave device, whether the received Inter-integrated Circuit interrupt is one of either a hardware interrupt or a software interrupt;
   wherein the slave device is configured to receive hardware interrupts and software interrupts;
   in the event the received Inter-integrated Circuit interrupt is a hardware interrupt, responding, by the slave device, to the hardware interrupt, and accessing a flash memory for read/write operation based on the hardware interrupt; and
   in the event the received Inter-integrated Circuit interrupt is a software interrupt, responding, by the slave device, to the software interrupt, and accessing a flash memory for read/write operation based on the software interrupt;
   wherein responding to the hardware interrupt comprises responding in a first addressing mode and wherein responding to the software interrupt comprises responding in a second addressing mode, wherein the second addressing mode is different from the first addressing mode.

2. The method of claim 1, further comprising:
  determining, by the slave device, whether the received Inter-integrated Circuit interrupt references a supported Inter-integrated Circuit address; and
  responding to the received Inter-integrated Circuit interrupt only in the event that the received Inter-integrated Circuit interrupt references a supported Inter-integrated Circuit address.

3. The method of claim 1, wherein determining whether the Inter-integrated Circuit interrupt is one of either a hardware interrupt or a software interrupt comprises identifying an active signal set between a first pair of wires and a second pair of wires.

4. The method of claim 1, wherein the first addressing mode is a 16-bit addressing mode and the second addressing mode is an 8-bit addressing mode.

5. The method of claim 1, further comprising:
  emulating, by the slave device, a first Inter-integrated Circuit engine; and
  emulating, by the slave device, a second Inter-integrated Circuit engine.

6. The method of claim 1, further comprising:
  emulating, by the slave device, a single 512-byte flash memory array accessible by the hardware interrupt; and
  emulating, by the slave device, two 256-byte flash memory arrays accessible by the software interrupt.

7. The method of claim 1, wherein the bus comprises multiple masters.

8. The method of claim 1, wherein the bus comprises multiple chips.

9. The method of claim 1, wherein the slave device comprises a flash memory.

10. A system, comprising:
  an Inter-integrated Circuit slave device comprising a flash memory array, a first Inter-integrated Circuit port, and a second Inter-integrated Circuit port;
  wherein the slave device is configured to receive hardware interrupts and software interrupts;
  wherein the flash memory array is configured to couple to an Inter-integrated Circuit bus;
  wherein the first Inter-integrated Circuit port couples to the flash memory array, the first port comprising a first pair of Inter-integrated Circuit wires and a hardware Inter-integrated Circuit engine coupled to the first pair of Inter-integrated Circuit wires and configured to respond to received hardware interrupts in a first addressing protocol;
  wherein the second Inter-integrated Circuit port couples to the flash memory array, the second port comprising a second pair of Inter-integrated Circuit wires and a software Inter-integrated Circuit engine coupled to the second pair of wires and configured to respond to received software interrupts in a second addressing protocol, differing from the first addressing protocol; and
  wherein the first Inter-integrated Circuit port interfaces with the flash memory array as a single array;
  wherein the second Inter-integrated Circuit port interfaces with the flash memory array as two independent arrays; and
  wherein the first Inter-integrated Circuit port and the second Inter-integrated Circuit port are accessible to the Inter-integrated Circuit bus.

11. The system of claim 10, wherein the system comprises a programmable system-on-chip.

12. The system of claim 10, wherein the first Inter-integrated Circuit port interfaces with the flash memory array as a single array comprising 512 bytes; and wherein the second Inter-integrated Circuit port interfaces with the flash memory array as two independent arrays, each comprising 256 bytes.

13. The system of claim 10, wherein:
  the first Inter-integrated Circuit port further comprises a main power interface; and
  the second Inter-integrated Circuit port further comprises a standby power interface.

14. The system of claim 10, further comprising an address translation table coupled to the first Inter-integrated Circuit port and the second Inter-integrated Circuit port.

15. The system of claim 10, further comprising a memory buffer coupled to the flash memory array, the first Inter-integrated Circuit port, and the second Inter-integrated Circuit port.

16. An apparatus comprising a computer program product for emulating a dual-port Inter-integrated Circuit slave device, the computer program product having a tangible computer-readable storage medium with a computer program embodied thereon, the computer program comprising:
  computer code for monitoring, by an Inter-integrated Circuit slave device, a bus for Inter-integrated Circuit traffic;
  computer code for receiving, by the slave device, an Inter-integrated Circuit interrupt on the bus;
  computer code for determining, by the slave device, whether the received Inter-integrated Circuit interrupt is one of either a hardware interrupt or a software interrupt;
  wherein the slave device is configured to receive hardware interrupts and software interrupts;
  computer code for, in the event the received Inter-integrated Circuit interrupt is a hardware interrupt, responding, by the slave device, to the hardware interrupt, and accessing a flash memory for read/write operation based on the hardware interrupt; and
  computer code for, in the event the received Inter-integrated Circuit interrupt is a software interrupt responding, by the slave device, to the software interrupt, and accessing a flash memory for read/write operation based on the software interrupt;
  wherein responding to the hardware interrupt comprises responding in a first addressing mode and wherein responding to the software interrupt comprises responding in a second addressing mode, wherein the second addressing mode is different from the first addressing mode.

17. The apparatus of claim 16, further comprising:
  computer code for determining, by the slave device, whether the received Inter-integrated Circuit interrupt references a supported Inter-integrated Circuit address; and
  computer code for responding, by the slave device, to the received Inter-integrated Circuit interrupt only in the event that the received Inter-integrated Circuit interrupt references a supported Inter-integrated Circuit address.

18. The apparatus of claim 16, wherein the first addressing mode is a 16-bit addressing mode and the second addressing mode is an 8-bit addressing mode.

* * * * *